United States Patent
Buonodono (10) Patent No.: US 9,520,312 B2
(45) Date of Patent: Dec. 13, 2016

(54) SYSTEM AND METHOD FOR MOVING WORKPIECES BETWEEN MULTIPLE VACUUM ENVIRONMENTS

(71) Applicant: Varian Semiconductor Equipment Associates, Inc., Gloucester, MA (US)

(72) Inventor: James P. Buonodono, Amesbury, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 11 days.

(21) Appl. No.: 14/577,187

(22) Filed: Dec. 19, 2014

(65) Prior Publication Data
US 2016/0181135 A1    Jun. 23, 2016

(51) Int. Cl.
*H01L 21/67* (2006.01)
*H01L 21/677* (2006.01)
*H01L 21/687* (2006.01)

(52) U.S. Cl.
CPC ... *H01L 21/67742* (2013.01); *H01L 21/67126* (2013.01); *H01L 21/67213* (2013.01); *H01L 21/67748* (2013.01); *H01L 21/68764* (2013.01)

(58) Field of Classification Search
CPC ............. H01L 21/67742; H01L 21/673; H01L 21/67126
USPC ................................................. 414/217, 939
See application file for complete search history.

(56) References Cited

U.S. PATENT DOCUMENTS

| | | | | |
|---|---|---|---|---|
| 6,082,948 A * | 7/2000 | Fishkin | ............. | H01L 21/67757 414/217 |
| 6,571,657 B1 * | 6/2003 | Olgado | .................. | B25J 9/1638 257/E21.175 |
| 7,029,224 B2 * | 4/2006 | Kubo | ..................... | B25J 15/103 414/680 |
| 7,677,885 B2 * | 3/2010 | Lin | ................... | H01L 21/67742 414/152 |
| 7,682,454 B2 * | 3/2010 | Sneh | ..................... | C23C 14/566 118/719 |
| 7,875,144 B2 * | 1/2011 | Kobayashi | ........ | H01L 21/67092 156/247 |
| 7,967,048 B2 * | 6/2011 | Yoshioka | .......... | H01L 21/67132 156/362 |
| 8,303,716 B2 * | 11/2012 | Wallace | ............ | H01L 21/67109 118/724 |
| 8,403,613 B2 * | 3/2013 | van der Meulen | .... | B65G 25/02 414/217 |

(Continued)

Primary Examiner — Kaitlin Joerger (57) ABSTRACT

Provided are approaches for transferring workpieces between multiple pressure environments. In one approach, a system for moving workpieces between a first pressure environment and a second pressure environment includes a first vacuum enclosure, a second vacuum enclosure, and an access port disposed between the first vacuum enclosure and the second vacuum enclosure. The system further includes a transfer carrier having a workpiece holder for retaining a workpiece, the transfer carrier disposed within the first vacuum enclosure and moveable between a first process position and a second process position, wherein in the first process position the workpiece is disposed within the first vacuum enclosure, and wherein in the second process position the workpiece holder abuts the access port to expose the workpiece to the second vacuum enclosure and to create a seal around the access port to seal the first vacuum enclosure from the second vacuum enclosure.

20 Claims, 10 Drawing Sheets

(56) References Cited

U.S. PATENT DOCUMENTS

| | | | |
|---|---|---|---|
| 8,740,537 B2* | 6/2014 | Reising | H01L 21/67126 414/217 |
| 8,911,553 B2* | 12/2014 | Baluja | C23C 16/4405 118/715 |
| 9,136,151 B2* | 9/2015 | Van Der Blij | H01L 21/67126 |
| 2014/0087561 A1* | 3/2014 | Lee | H01L 21/68742 438/689 |
| 2014/0271081 A1* | 9/2014 | Lavitsky | H01L 21/67103 414/744.2 |
| 2015/0299859 A1* | 10/2015 | Kilpi | C23C 16/45546 427/255.28 |
| 2015/0325462 A1* | 11/2015 | Abe | H01L 21/67353 206/710 |

* cited by examiner

SYSTEM AND METHOD FOR MOVING WORKPIECES BETWEEN MULTIPLE VACUUM ENVIRONMENTS

FIELD OF THE DISCLOSURE

The disclosure relates generally to the field of semiconductor device fabrication, and more particularly to a device and method for moving semiconductor workpieces between multiple vacuum environments.

BACKGROUND OF THE DISCLOSURE

Ion implantation is a technique for introducing conductivity-altering impurities into semiconductor workpieces. During ion implantation, an intended impurity material is ionized in an ion source chamber, the ions are accelerated to form an ion beam of prescribed energy, and the ion beam is focused and directed toward the surface of a workpiece positioned in a vacuum enclosure. The energetic ions in the ion beam penetrate into the bulk of the workpiece material and are embedded into the crystalline lattice of the material to form a region of intended conductivity.

Semiconductor work pieces are highly susceptible to particulate contamination that can detrimentally alter the conductivity characteristics of a workpiece. In order to mitigate such contamination, ion implantation is typically performed in high vacuum pressure environments. It is therefore beneficial to employ transfer devices for moving workpieces into and out of such vacuum environments in an expeditious manner, while simultaneously minimizing the creation and transmission of particulate matter.

A typical architecture for dealing with two or more processes for a workpiece consists of a mainframe, which provides the mechanisms for handling the workpiece from one process environment to the other. The mainframe can consist of a vacuum chamber, one or more isolation valves (e.g., depending on the number of individual process facets), a workpiece handling robot, and a vacuum system. The mainframe is often the location in which the vacuum level is adjusted to suit varying process operations, depending upon which process the workpiece is being prepared for. As will be appreciated, adjusting the vacuum level in the mainframe is time consuming and employs large, expensive pumps due to the relatively large volume of the mainframe chamber.

SUMMARY

In view of the foregoing, it would be advantageous to provide a system and method for moving workpieces between multiple vacuum pressure environments in a sequential manner without having to unload or re-position a workpiece held by a workpiece holder. Moreover, it would be advantageous to provide such a system and method that minimize the presence of contaminants to which transferred workpieces are exposed, while simultaneously improving processing throughput.

An exemplary system for moving workpieces between a first pressure environment and a second pressure environment in accordance with the present disclosure may include a first vacuum enclosure and a second vacuum enclosure, an access port disposed between the first vacuum enclosure and the second vacuum enclosure, and a transfer carrier having a workpiece holder for retaining a workpiece, the transfer carrier disposed within the first vacuum enclosure and moveable between a first process position and a second process position. In the first process position the workpiece is disposed within the first vacuum enclosure, and in the second process position the workpiece holder abuts the access port to expose the workpiece to the second vacuum enclosure and to create a seal around the access port to seal the first vacuum enclosure from the second vacuum enclosure.

An exemplary transfer carrier for moving workpieces between a first pressure environment and a second pressure environment in accordance with the present disclosure may include a workpiece holder for retaining a workpiece, the transfer carrier disposed within a first vacuum enclosure and moveable between a first process position and a second process position. In the first process position the workpiece is disposed within the first vacuum enclosure, and in a second process position the workpiece holder abuts an inner surface of the first vacuum enclosure surrounding an access port disposed between the first vacuum enclosure and a second vacuum enclosure to regulate exposure of the workpiece to the second vacuum enclosure using a valve of the access port and to create a seal around the access port to seal the first vacuum enclosure from the second vacuum enclosure.

An exemplary method for moving workpieces between a first pressure environment and a second pressure environment in accordance with the present disclosure may include providing a first vacuum enclosure coupled to a second vacuum enclosure, the first vacuum enclosure having a first vacuum pressure level and the second vacuum enclosure having a second vacuum pressure level, performing a first process on a workpiece in the first vacuum enclosure, the workpiece retained by a workpiece holder of a transfer carrier, moving the transfer carrier between a first process position within the first vacuum enclosure to a second process position in which the workpiece holder abuts an access port connecting the first vacuum enclosure and the second vacuum enclosure, creating a seal around the access port, opening the access port to expose the workpiece to an interior of the second vacuum enclosure; and performing a second process on the workpiece in the second vacuum enclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

DETAILED DESCRIPTION

A system and method in accordance with the present disclosure will now be described more fully hereinafter with reference to the accompanying drawings, in which embodiments of the system and method are shown. The system and method, however, may be embodied in many different forms and should not be construed as being limited to the embodiments set forth herein. Rather, these embodiments are provided so that this disclosure will be thorough and complete, and will fully convey the scope of the system and method to those skilled in the art.

Figure 1:
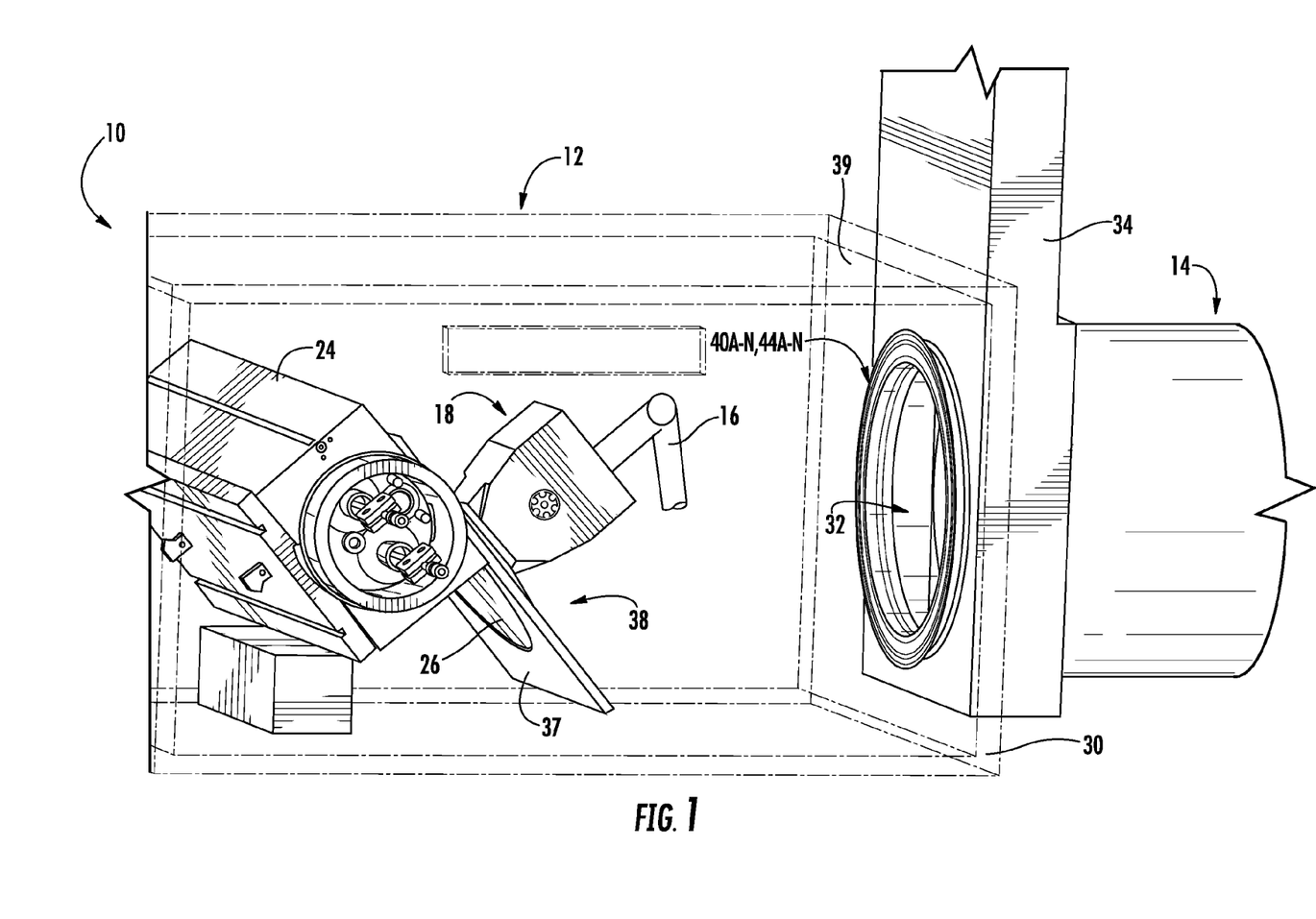
FIG. 1 is an isometric semi-transparent view illustrating an exemplary vacuum transfer system in accordance with the present disclosure.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a system 10 as it appears in FIG. 1. Said terminology will include the words specifically mentioned, derivatives thereof, and words of similar import.

As used herein, an element or operation recited in the singular and proceeded with the word "a" or "an" should be understood as not excluding plural elements or operations, unless such exclusion is explicitly recited. Furthermore, references to "one embodiment" of the present disclosure are not intended to be interpreted as excluding the existence of additional embodiments that also incorporate the recited features.

As stated above, provided herein are approaches for moving workpieces between a first pressure environment and a second pressure environment. In one approach, a system for moving workpieces between a first pressure environment and a second pressure environment includes a first vacuum enclosure, a second vacuum enclosure, and an access port disposed between the first vacuum enclosure and the second vacuum enclosure. The system further includes a transfer carrier having a workpiece holder for retaining a workpiece, the transfer carrier disposed within the first vacuum enclosure and moveable between a first process position and a second process position, wherein in the first process position the workpiece is disposed within the first vacuum enclosure, and wherein in the second process position the workpiece holder abuts the access port to expose the workpiece to the second vacuum enclosure and to create a seal around the access port to seal the first vacuum enclosure from the second vacuum enclosure.

Figure 2:
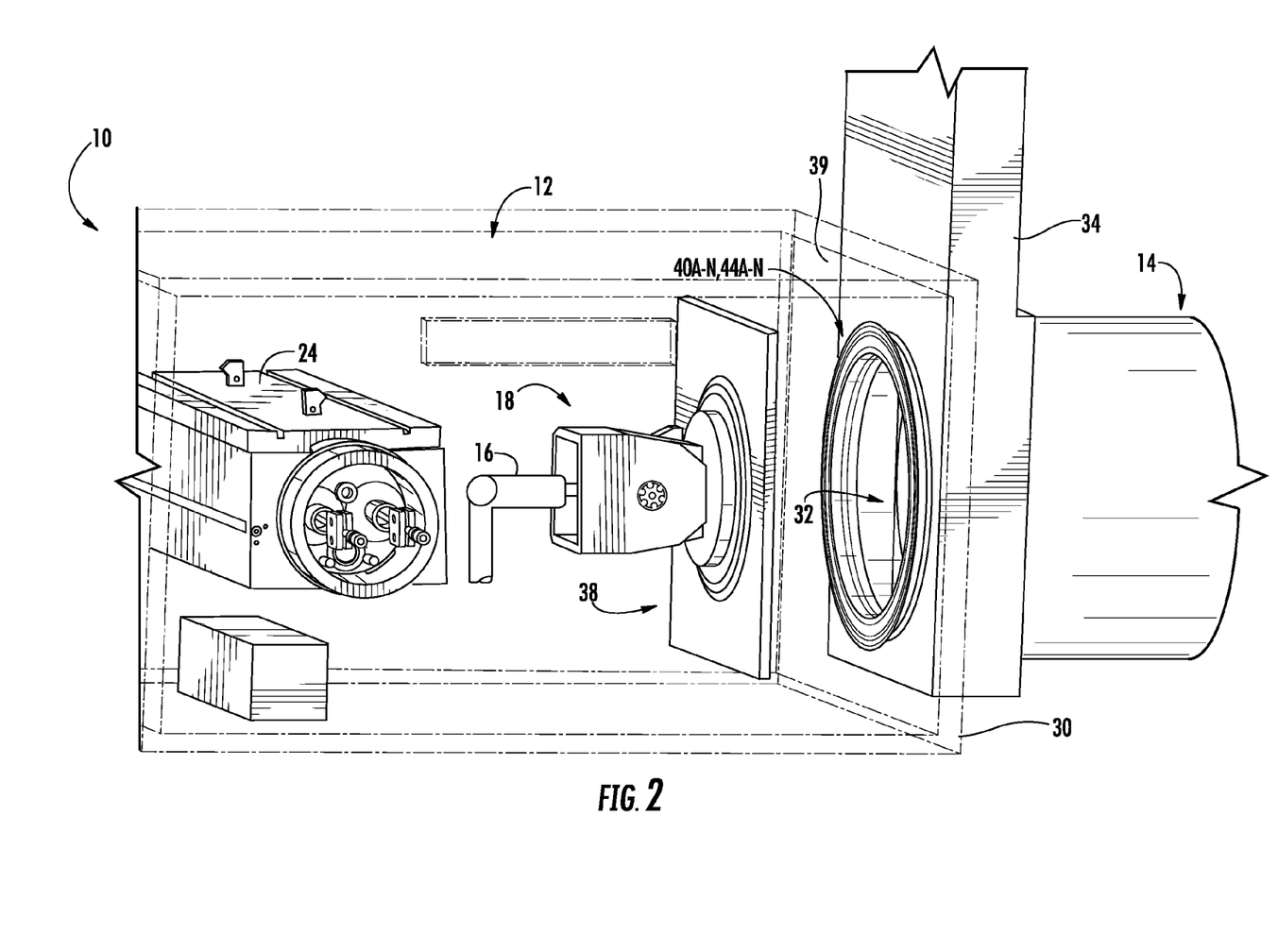
FIG. 2 is an isometric semi-transparent view illustrating movement of a workpiece of the exemplary vacuum transfer system shown in FIG. 1.
Figure 3:
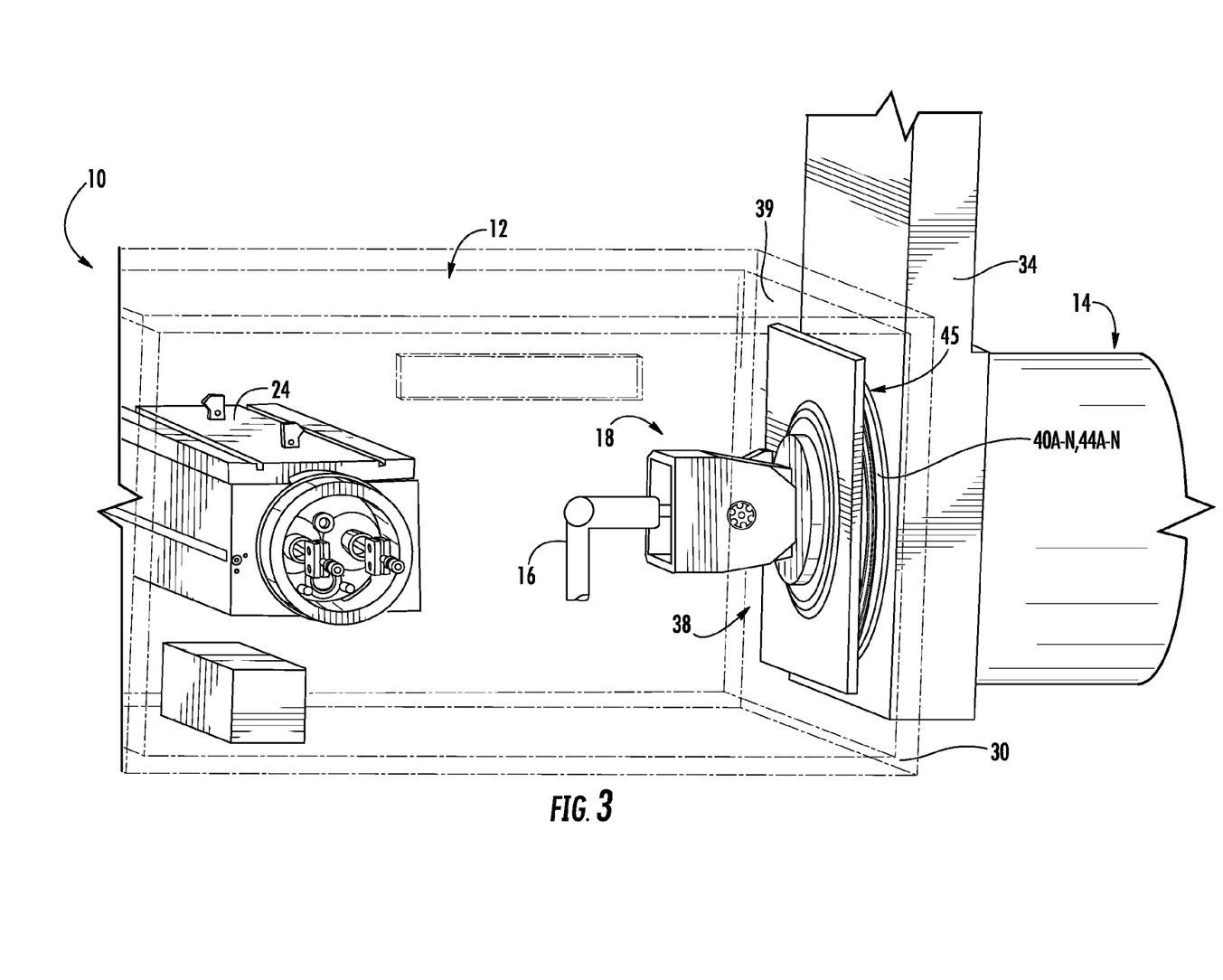
FIG. 3 an isometric semi-transparent view illustrating abutment of a workpiece holder against a sidewall of a first vacuum enclosure of the exemplary vacuum transfer system shown in FIG. 1.

Referring to FIGS. 1-3, an exemplary embodiment of a system 10 for transferring workpieces into and out of vacuum environments in accordance with the present disclosure is shown. The exemplary system 10 is described herein as being used for moving workpieces (e.g., semiconductor substrates) between a first pressure environment corresponding to a first vacuum enclosure 12 having a first vacuum pressure level, and a second pressure environment corresponding to a second vacuum enclosure 14 having a second vacuum pressure level. As demonstrated, the first vacuum enclosure 12 is coupled to the second vacuum enclosure 14 in a non-limiting side-by-side configuration. However, it will be appreciated by those of ordinary skill in the art that the system 10 may be similarly implemented in virtually any type of process, system, or configuration in which workpieces are moved between vacuum and/or non-vacuum environments. Examples of processes that can be performed on a workpiece in either or both of the first vacuum enclosure 12 and the second vacuum enclosure 14 include, but are not limited to, milling, deposition, etching, ashing, cleaning, lithography, and inspection. Other applications are contemplated and may be implemented without departing from the scope of the present disclosure.

It will be further appreciated that during wafer processing operations, the first vacuum enclosure 12 will often be held under high vacuum conditions (a non-limiting exemplary range being approximately $1\times10^{-5}$ to $1\times10^{-7}$ Torr), while conditions outside the first vacuum enclosure 12 are often at ambient conditions. Meanwhile, the second vacuum enclosure 14 can be held under relatively lower vacuum conditions (a non-limiting exemplary range being approximately 20-30 Torr), while conditions outside the second vacuum enclosure 14 can be at ambient conditions. It will be appreciated that such arrangements are not limiting, and in some embodiments the first vacuum enclosure 12 and the second vacuum enclosure can be held under substantially equal vacuum conditions.

In one non-limiting exemplary embodiment, the first vacuum environment corresponds to the interior of the first vacuum enclosure 12, which may include therein a plasma source 24 for performing a first process on a workpiece 26, for example. The second vacuum environment corresponds to the interior of the second vacuum enclosure 14, which may include therein any number and variety of workpiece processing devices (not shown) for performing a second process on the workpiece 26.

During operation, the workpiece 26 can be moved within the first vacuum enclosure 12 by a transfer arm 16 coupled to a transfer carrier 18. In one embodiment the transfer arm 16 can comprise one or more segments of a multiple degree of freedom robot disposed within the first vacuum enclosure 12. In some embodiments, the transfer carrier 18 itself can be configured to provide rotary and/or linear movements. It will be appreciated that the transfer arm 16 and transfer carrier are merely exemplary, and that similar motions can be achieved with other types of mechanisms.

The transfer carrier 18 may include a workpiece holder 38 for retaining and supporting the workpiece 26 during one or more processing operations. The workpiece holder 38 can comprise a platen that includes an electrostatic or mechanical clamping arrangement. The workpiece holder 38 is shown as having a relatively flat, rectangular shape. It will be appreciated, however, that this particular configuration the workpiece holder 38 may have any size, shape, and configuration that is suitable for securely supporting a workpiece during conveyance thereof. This may be dictated by the particular type of workpiece to be supported and the particular processes that are to be performed on the workpiece in both the first vacuum enclosure 12 and the second vacuum enclosure 14.

Although not shown, the transfer carrier 18 may be coupled to an appropriate control system to provide intended movement of the workpiece holder 38. The control system may include any one or combination of a variety of actuation elements, including magnetic motor arrangements, rotary cam arrangements, linear ball screws, and the like, to provide the intended linear and/or rotational motion. In some embodiments a curved linear motor and curved linear bearing arrangement could be used to impart intended motion to the transfer carrier 18. In some embodiments, the control system can include a servo actuator with encoder feedback for position determination. Linear motion of the transfer arm 16, if intended, could be implemented using a linear motor and linear bearing arrangement traveling on the curved linear motor and bearing arrangement.

As further shown, a sidewall 30 of the first vacuum enclosure 12 includes an access port 32 disposed between the first vacuum enclosure 12 and the second vacuum enclosure 14. In a non-limiting exemplary embodiment, the access port 32 further includes a valve 34 for regulating/controlling access between the first vacuum enclosure 12 and the second vacuum enclosure 14 and for sealing the environment of the first vacuum enclosure from the second vacuum enclosure. In some embodiments, the valve 34 can be a slit valve or gate valve, though other valve types can also be used. As will be further described below, the valve 34 of the access port 32 is configured to open and close, as intended, to allow for performance of a series of processing operations on the workpiece 26, while maintaining the first vacuum pressure of the first vacuum enclosure 12 separate from the second vacuum pressure of the second vacuum enclosure 14. It will be appreciated that although a single access port 32 is illustrated, it is contemplated that the first vacuum enclosure 12 and the second vacuum enclosure 14 could alternatively include a plurality of such access ports.

During operation of the system 10, the transfer carrier 18 can be cycled between several predetermined processing positions within the first vacuum enclosure 12 to achieve an intended processing scheme for the workpiece 26. For example, once the workpiece 26 is loaded onto the workpiece holder 38, the transfer carrier 18 can be moved to a first process position, wherein the workpiece holder 38 is aligned with the plasma source 24 for performing a first processing operation (e.g., ion implantation) on the workpiece 26. During this first processing operation the workpiece holder 38 and/or the plasma source 24 may move through a series of linear and/or rotational motions to implant the workpiece 26 in an intended manner. Once the first processing operation is complete, transfer carrier 18 is moved (FIG. 2) to a second process position within the first vacuum enclosure 12 so that a surface 37 (FIG. 1) of the workpiece holder 38 abuts a corresponding surface 39 of the sidewall 30 of the first vacuum enclosure 12, thus aligning the workpiece 26 with the access port 32, as shown in FIG. 3.

The workpiece holder 38 may be configured to engage/abut the sidewall 30 of the first vacuum enclosure 12, so that a seal 45 is formed around the access port 32 sufficient to prevent movement of a fluid (e.g., air or gas) into or out of access port 32. As will be appreciated, fluid movement between the first vacuum enclosure 12 and the second vacuum enclosure 14 could adversely affect the vacuum levels in the first vacuum enclosure 12 and/or the second vacuum enclosure 14. Thus, the seal 45 maintains the respective pressure levels of the first vacuum enclosure 12 and the second vacuum enclosure 14 once the valve 34 is opened, as will be further described below.

Figure 4:
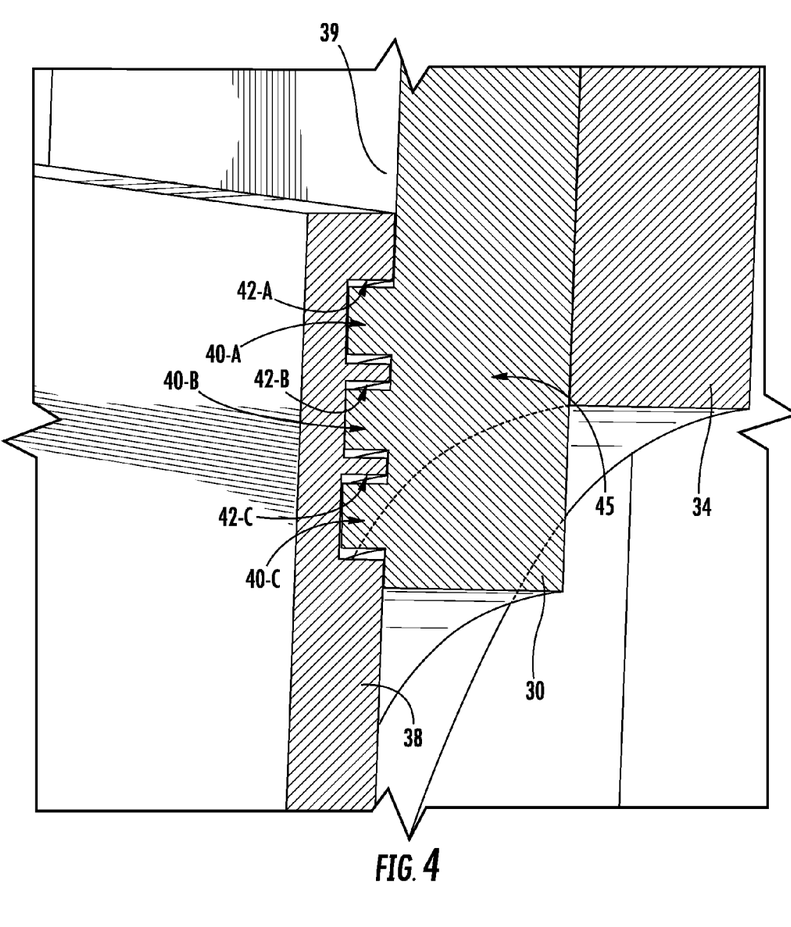
FIG. 4 is an isometric cutaway view illustrating seal using a vacuum conductance limiting configuration of the exemplary vacuum transfer system shown in FIG. 1.
Figure 5:
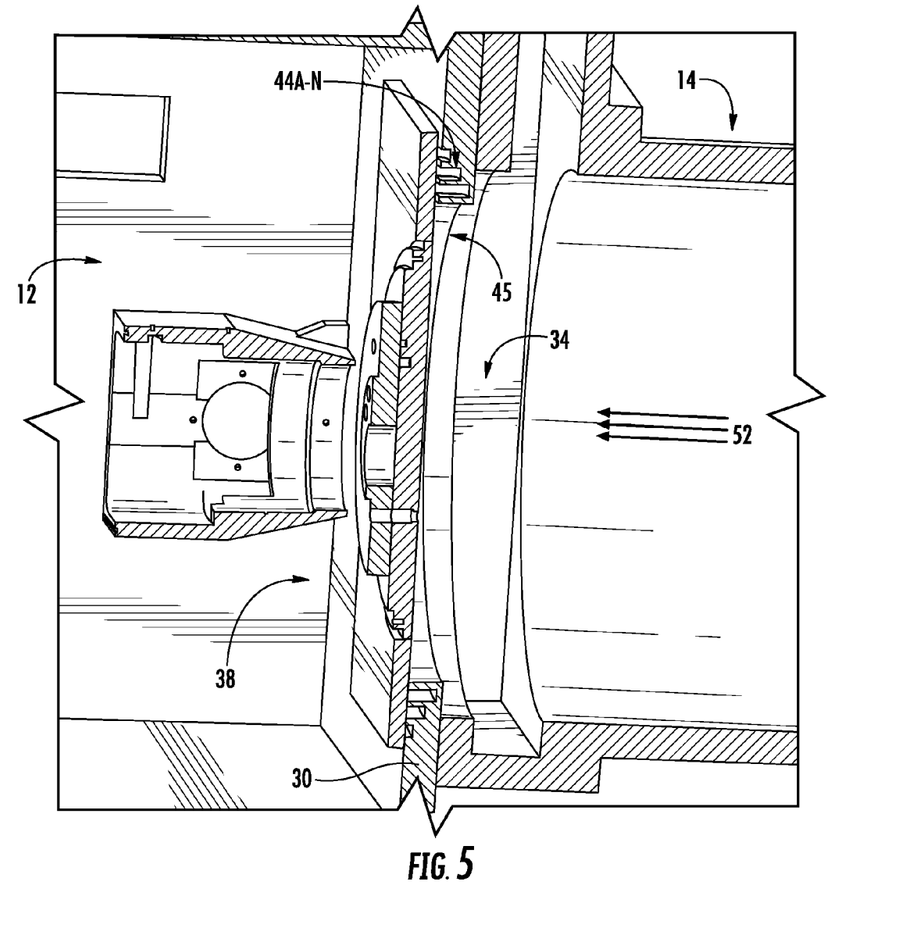
FIG. 5 is an isometric cutaway view illustrating a seal using a set of non-contact vacuum isolation grooves of the exemplary vacuum transfer system shown in FIG. 1.
Figure 6:
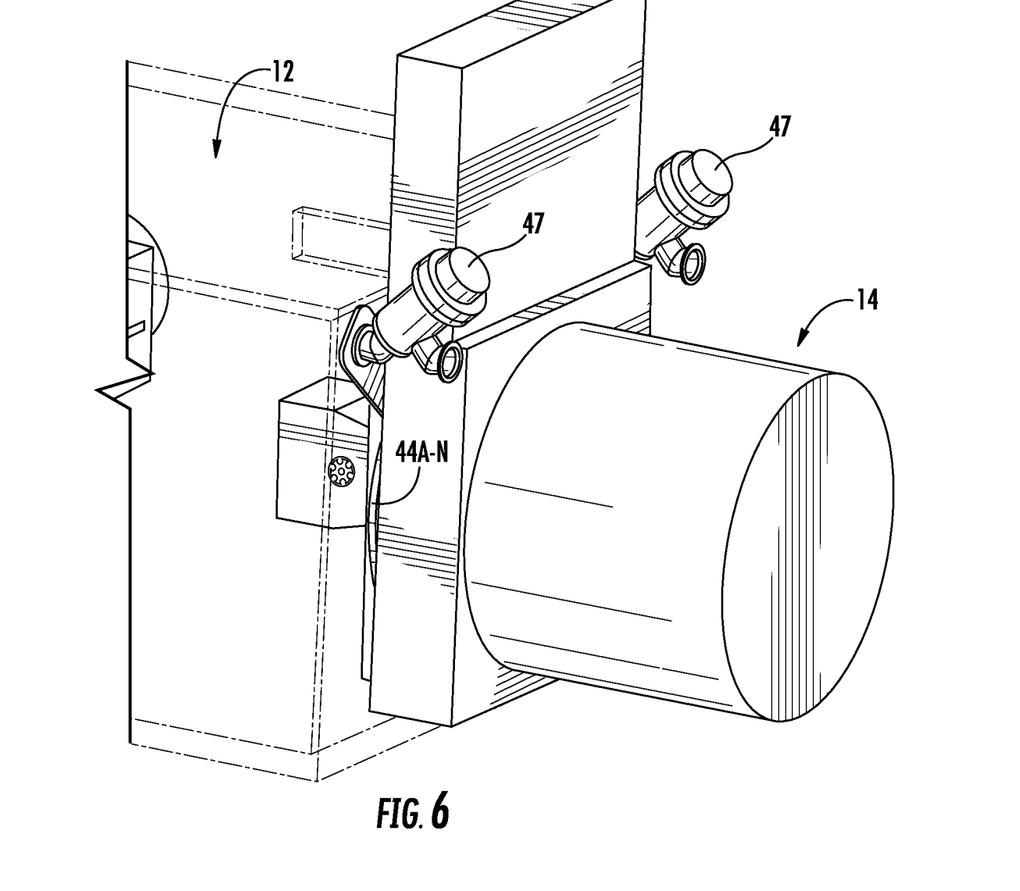
FIG. 6 is an isometric semi-transparent view illustrating a set of vacuum valves operating with the non-contact vacuum isolation grooves of the exemplary vacuum transfer system shown in FIG. 1.
Figure 7:
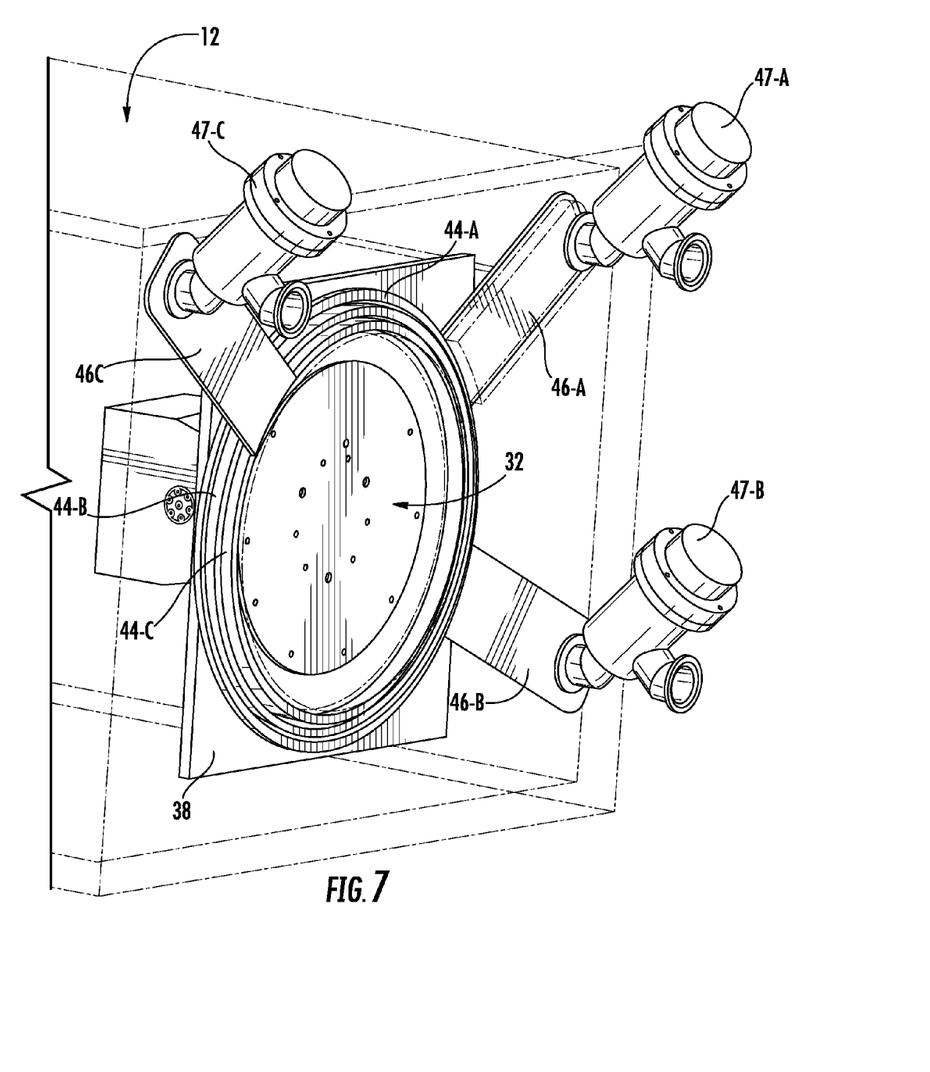
FIG. 7 is an isometric semi-transparent view illustrating the set of vacuum valves and a set of conduits operating with the non-contact vacuum isolation grooves of the exemplary vacuum transfer system shown in FIG. 1.
Figure 8:
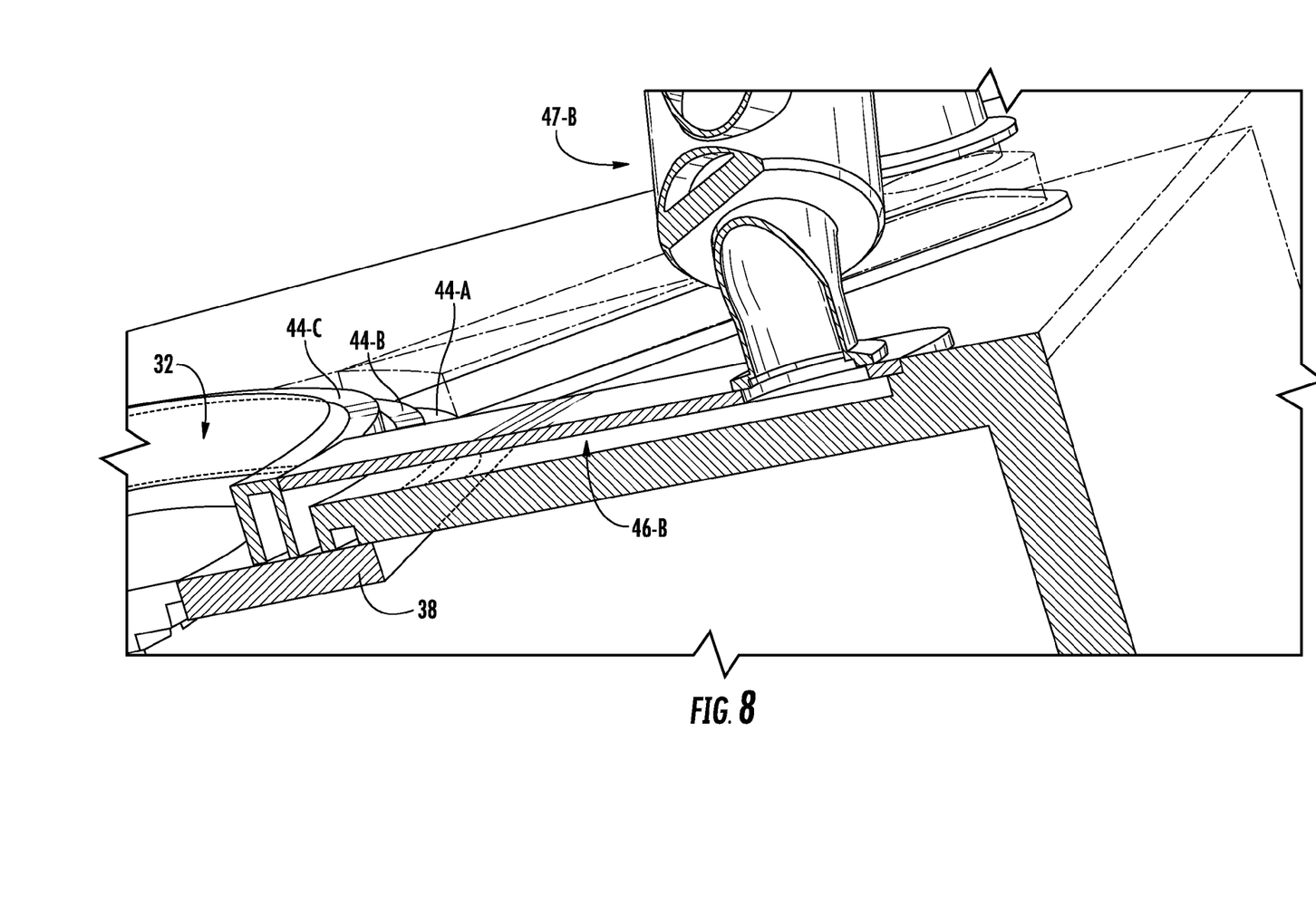
FIG. 8 is an isometric cutaway view illustrating a set of vacuum valves operating with the non-contact vacuum isolation grooves and the set of conduits of the exemplary vacuum transfer system shown in FIG. 1.

A number of approaches for providing the seal 45 can be employed. For example, in the non-limiting embodiment shown in FIGS. 1-4, the seal around the access port 32 is achieved using a vacuum conductance limiting configuration in which a set of annular protrusions 40A-N are provided in the sidewall 30 of the first vacuum enclosure 12 along a perimeter of the access port 32. This configuration further includes a set of annular grooves 42A-N (FIG. 4) in the workpiece holder 38 for engaging the set of annular protrusions 40A-N when the transfer carrier 18 is in the second position (FIG. 3). Once the set of annular protrusions 40A-N are engaged with the set of annular grooves 42A-N, as shown in FIG. 4, a vacuum conductance limiting condition is created, isolating the high vacuum environment within the first vacuum enclosure 12 from a secondary process operation, which is subsequently performed via the second vacuum enclosure 14. This type of conductance limiting seal 45 is appropriate for cases in which the vacuum levels in the first vacuum enclosure 12 and the second vacuum enclosure 14 are relatively similar, and/or where the processes being applied in the first vacuum enclosure and the second vacuum enclosure are not sensitive to slight pressure variations or cross-flow.

In another non-limiting embodiment, as shown in FIGS. 1-3 and 5-8, the seal 45 can be effected using a set of non-contact vacuum isolation pumping grooves 44A-N (hereinafter "pumping grooves") provided within the sidewall 30 and along a perimeter of the access port 32. The differential pumping approach provided in this embodiment includes the pumping grooves 44A-N arranged to form individual continuous openings surrounding the access port 32. That is, the opposite ends of each of the pumping grooves 44 may be coupled to conduits 46A-N within the sidewall 30 (FIG. 7) and then to a vacuum source (not shown) via a plurality of vacuum valves 47A-N, each configured to draw a fluid (e.g., gas or air) out through the pumping grooves 44A-N. In one non-limiting embodiment, each vacuum valve 47A-N includes an electrical signal or pneumatic control to facilitate opening/closing thereof. As will be appreciated, any air or other gas entering the region between the workpiece holder 38 and the access port 32 will be drawn out through the pumping grooves 44A-N before reaching the first or second vacuum enclosure 12, 14. In the illustrated embodiment of FIGS. 7-8, one vacuum valve is provided for each groove. That is, each pumping groove 44A-C is coupled to a corresponding conduit 46A-C and vacuum valve 47A-C. It will be appreciated, however, that in other embodiments additional conduits and/or vacuum valves can be added to a particular conduit, e.g., in the case that increased pumping/vacuum pressure is intended.

Figure 9:
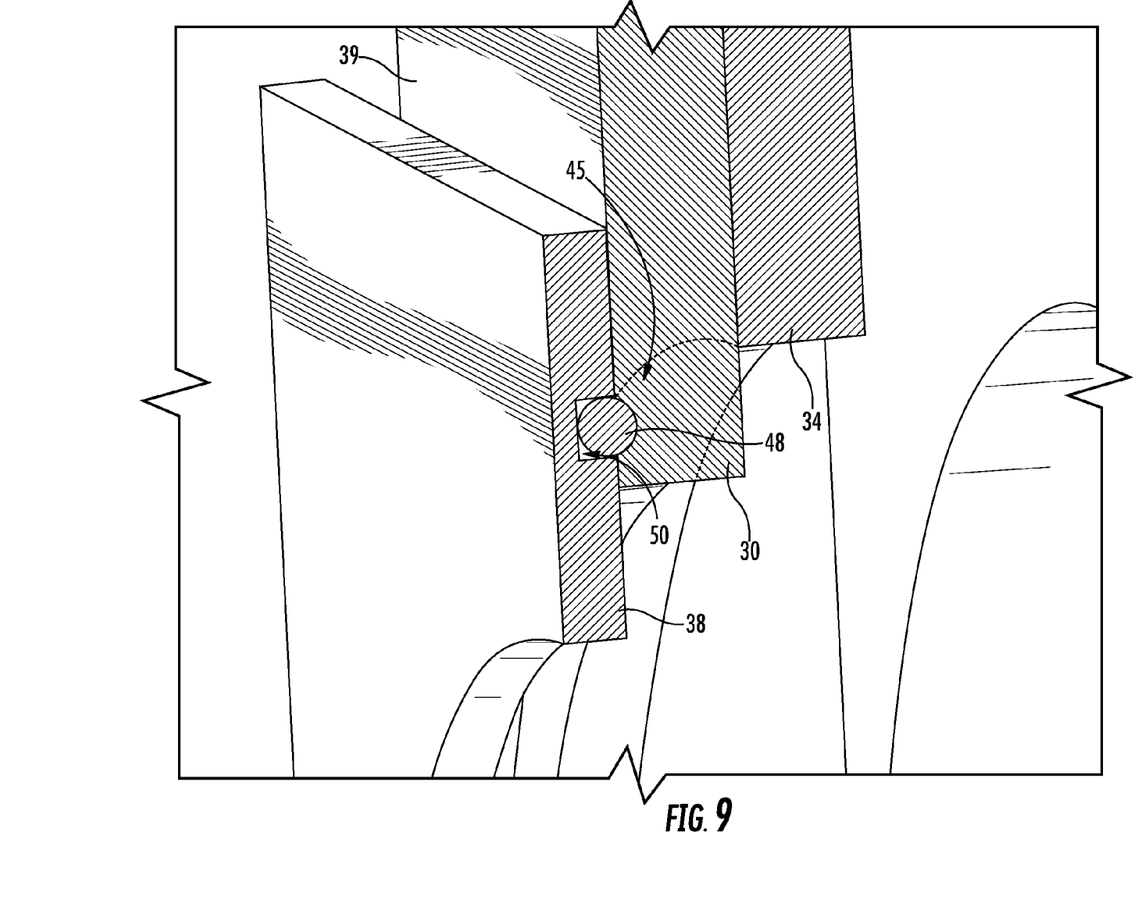
FIG. 9 is an isometric cutaway view illustrating creation of a seal created by an O-ring of the exemplary vacuum transfer system shown in FIG. 1.

In another non-limiting exemplary embodiment, shown in FIG. 9, the seal 45 around the access port can be achieved with an O-ring arrangement. In this embodiment, the workpiece holder 38 includes an O-ring 48 positioned within a retaining groove 50. The O-ring 48 is configured to contact the inner surface 39 of the sidewall 30 of the first vacuum enclosure. It will be understood that the O-ring 48 can be made from any of a variety of suitable elastomers. In the present embodiment, the O-ring can be seated in the retaining groove 50 and is compressed to form a seal between the workpiece holder 38 and the sidewall 30 when the workpiece holder is brought in contact the sidewall. When the O-ring 48 engages the sidewall 30, the high vacuum environment within the first vacuum enclosure 12 is isolated from the lower vacuum environment of the second vacuum enclosure 14 to prevent unwanted movement of gas therebetween. It will be appreciated that although the seal of this embodiment can be achieved using an O-ring, that other seal types (e.g., gasket, lip-seal, or the like) could alternatively be used to form the seal. In addition, although a single O-ring 48 is shown, multiple concentrically placed O-rings (or gaskets, lip-seals, etc.) could be used.

Once the seal 45 between the first vacuum enclosure 12 and the second vacuum enclosure 14 is achieved, (e.g., using any of the aforementioned approaches), a second process 52 (FIG. 5) (a non-limiting exemplary listing of which includes atomic layer deposition (ALD), capping, or the like) can be performed on the workpiece 26. To accomplish this, the valve 34 may be cycled from a closed position to an open position to expose the workpiece 26 to an interior of the second vacuum enclosure 14 via access port 32. The second process is then performed using a processing system within or exposed to the interior of the second vacuum enclosure. Following completion of the second process, the valve 34 of the access port 32 can be cycled to the closed position, and the transfer carrier 18 can be moved from the second process position to the first process position (FIG. 1) where a third process may be performed on the workpiece 26 in the first vacuum enclosure 12. Alternatively, the workpiece 26 may be removed from the first vacuum enclosure 12 rather than having a further processing operation performed.

Throughout this traversal of the transfer carrier 18, it will be appreciated that the workpiece 26 may be continuously engaged by the workpiece holder 38 (i.e., from a start of the first process until a completion of the second and third processes). System 10 avoids the need to unload or re-handle the workpiece, thus reducing the potential for contamination and increasing processing thru put. As will be appreciated, as node sizes continue to shrink, and the structures on workpieces grow in complexity, system 10 can accommodate such developments by allowing a first processing operation to be performed at a first vacuum pressure, performing a second processing operation at a second vacuum pressure level, then returning to the first vacuum pressure for one or more additional processing operations. These processing operations at different pressure levels can be achieved without having to adjust or otherwise change the pressure in either or both of the first and second vacuum enclosure 12, 14.

Figure 10:
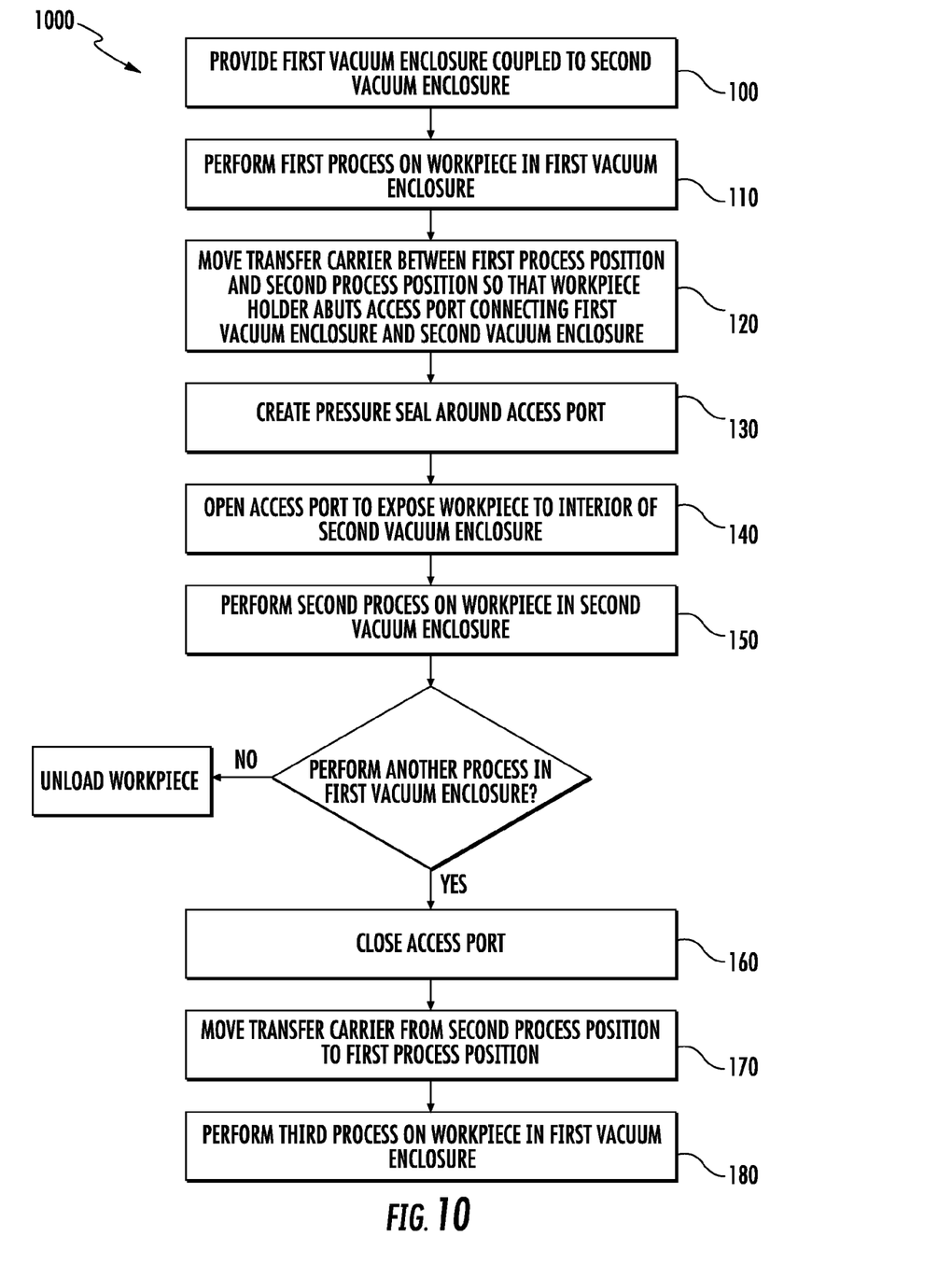
FIG. 10 is a flowchart illustrating an exemplary method according to the disclosure.

Referring now to FIG. 10, a flow diagram illustrating an exemplary method 1000 for operating the system 10 in accordance with the present disclosure is shown. The method 1000 will be described in conjunction with the representations of the system 10 shown in FIGS. 1-9.

Method 1000 includes providing a first vacuum enclosure 12 coupled to a second vacuum enclosure 14, as shown in block 100. In some embodiments, the first vacuum enclosure 12 has a first vacuum pressure level and the second vacuum enclosure 14 has a second vacuum pressure level. In some embodiments the first and second vacuum pressure levels are different, while in other embodiments the first and second vacuum pressure levels are substantially equal. Method 1000 further includes performing a first process on a workpiece 26 in the first vacuum enclosure 12, as shown in block 110. The workpiece 26 can be retained in a first process position by a workpiece holder 38 of a transfer carrier 18. Method 1000 further includes moving transfer carrier 18 from the first process position within the first vacuum enclosure 12 to a second process position in which the workpiece holder 38 abuts an access port 32 connecting the first vacuum enclosure 12 and the second vacuum enclosure 14, as shown in block 120. Method 1000 further includes creating a seal around the access port, as shown in block 130, and opening a valve 34 of the access port 32 to expose the workpiece 26 to an interior of the second vacuum enclosure 14, as shown in block 140. Method 1000 further includes performing a second process is on the workpiece 26 in the second vacuum enclosure 14, as shown in block 150.

If a third process is to be performed on the workpiece 26, method 1000 includes closing the valve 34 of the access port 32, as shown at block 160. Method 1000 further includes moving the transfer carrier from the second process position to the first process position, as shown at block 170. Method 1000 further includes performing a third process on the workpiece 26 in the first vacuum enclosure 12, as shown in block 180.

In view of the foregoing, at least the following advantages are achieved by the embodiments disclosed herein. Firstly, once loaded, a workpiece may be continuously engaged by a workpiece holder, e.g., from a start of a first process until a completion of a second/third process. The system avoids the need to unload or re-handle the workpiece, thus reducing the potential for contamination, and increasing processing thru put. Secondly, processing operations at different pressure levels can be achieved without having to adjust or otherwise change the pressure in either or both of the first and second vacuum enclosures, which saves time, thus increasing processing throughput. The pressure seal formed around the access port when the workpiece abuts the sidewall of the first vacuum maintains pressure levels in both the first and second vacuum enclosures once the access port is opened in anticipation of a second process.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A system for moving workpieces between a first pressure environment and a second pressure environment, the system comprising:
   a first vacuum enclosure;
   a second vacuum enclosure;
   an access port disposed between the first vacuum enclosure and the second vacuum enclosure; and
   a transfer carrier having a workpiece holder for retaining a workpiece, the transfer carrier disposed within the first vacuum enclosure and moveable between a first process position and a second process position, wherein in the second process position the workpiece holder abuts the access port to expose the workpiece to the second vacuum enclosure and to create a seal around the access port to seal the first vacuum enclosure from the second vacuum enclosure,
   wherein the workpiece holder is disposed entirely within the first vacuum enclosure in the first process position and in the second process position, and wherein the workpiece is disposed only within the access port when the transfer carrier is in the second process position.

2. The system of claim 1, the access port comprising a valve configured to be in an open position when the transfer carrier is in the second process position and in a closed position when the transfer carrier is in the first process position.

3. The system of claim 1, the first vacuum enclosure configured to be held at a first vacuum pressure level, the second vacuum enclosure configured to be held at a second vacuum pressure level, the first vacuum pressure level being different than the second vacuum pressure level.

4. The system of claim 1, the first vacuum enclosure configured to be held at a first vacuum pressure level, the second vacuum enclosure configured to be held at a second vacuum pressure level, the first vacuum pressure level being substantially equal to the second vacuum pressure level.

5. The system of claim 1, further comprising a set of annular protrusions in a sidewall of the first vacuum enclosure, the set of annular protrusions located along a perimeter of the access port.

6. The system of claim 5, the workpiece holder comprising a set of annular grooves aligned to engage the set of annular protrusions.

7. The system of claim 1, the workpiece holder further comprising an O-ring in contact with a sidewall of the first vacuum enclosure when the transfer carrier is in the second process position.

8. The system of claim 1, further comprising a set of non-contact vacuum isolation pumping grooves along a perimeter of the access port.

9. A transfer carrier for moving workpieces between a first pressure environment and a second pressure environment, the transfer carrier comprising:
a workpiece holder for retaining a workpiece, the transfer carrier disposed within a first vacuum enclosure and moveable between a first process position and a second process position, wherein in the first process position the workpiece is disposed within the first vacuum enclosure, wherein in a second process position the workpiece holder abuts an inner surface of the first vacuum enclosure surrounding an access port disposed between the first vacuum enclosure and a second vacuum enclosure to regulate exposure of the workpiece to the second vacuum enclosure using a valve of the access port and to create a seal around the access port to seal the first vacuum enclosure from the second vacuum enclosure, wherein the workpiece holder is disposed entirely within the first vacuum enclosure in the first process position and in the second process position, and wherein the workpiece is disposed only within the access port when the transfer carrier is in the second process position.

10. The transfer carrier of claim 9, wherein a sidewall of the first vacuum enclosure includes a set of annular protrusions located along a perimeter of the access port, and wherein a set of annular grooves in the workpiece holder are aligned to engage the set of annular protrusions when the transfer carrier is in the second process position.

11. The transfer carrier of claim 9, the workpiece holder further comprising an O-ring in contact with a sidewall of the first vacuum enclosure when the transfer carrier is in the second process position.

12. The transfer carrier of claim 9, wherein a sidewall of the first vacuum enclosure comprises a set of non-contact vacuum isolation pumping grooves along a perimeter of the access port.

13. A method for moving workpieces between a first pressure environment and a second pressure environment, the method comprising:
providing a first vacuum enclosure coupled to a second vacuum enclosure, the first vacuum enclosure having a first vacuum pressure level and the second vacuum enclosure having a second vacuum pressure level;
performing a first process on a workpiece in the first vacuum enclosure, the workpiece retained in a first process position by a workpiece holder of a transfer carrier;
moving the transfer carrier between the first process position within the first vacuum enclosure to a second process position in which the workpiece holder abuts an access port connecting the first vacuum enclosure and the second vacuum enclosure, wherein the workpiece holder is disposed entirely within the first vacuum enclosure in the first process position and in the second process position, and wherein the workpiece is disposed only within the access port when the transfer carrier is the second process position;
creating a seal around the access port;
opening the access port to expose the workpiece to an interior of the second vacuum enclosure; and
performing a second process on the workpiece in the second vacuum enclosure.

14. The method of claim 13, wherein the workpiece is continuously retained by the workpiece holder from a start of the first process until a completion of the second process.

15. The method of claim 14, further comprising:
closing the access port following the completion of the second process;
moving the transfer carrier from the second process position to the first process position; and
performing a third process on the workpiece in the first vacuum enclosure.

16. The method of claim 13, wherein the first vacuum pressure level is higher than the second vacuum pressure level.

17. The method of claim 13, wherein the first vacuum pressure level is substantially equal to the second vacuum pressure level.

18. The method of claim 13, the creating the seal around the access port comprising engaging a set of annular protrusions in a sidewall of the first vacuum enclosure with a set of annular grooves in the workpiece holder.

19. The method of claim 13, the creating the seal around the access port comprising contacting a sidewall of the first vacuum enclosure using an O-ring.

20. The method of claim 13, the creating the seal around the access port comprising removing a fluid from a set of non-contact vacuum isolation pumping grooves positioned along a perimeter of the access port.

* * * * *